United States Patent
Ariyoshi

(10) Patent No.: US 7,242,341 B2
(45) Date of Patent: Jul. 10, 2007

(54) ANALOG-TO-DIGITAL CONVERTER AND ANALOG-TO-DIGITAL CONVERSION METHOD

(75) Inventor: Katsuhiko Ariyoshi, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/288,096

(22) Filed: Nov. 29, 2005

(65) Prior Publication Data

US 2007/0046521 A1     Mar. 1, 2007

(30) Foreign Application Priority Data

Aug. 30, 2005   (JP)   ............................. 2005-249813

(51) Int. Cl.
*H03M 1/60*   (2006.01)

(52) U.S. Cl. ........................................ 341/157; 341/155

(58) Field of Classification Search ......... 341/100–172
See application file for complete search history.

(56) References Cited

U.S. PATENT DOCUMENTS

| 5,017,860 | A  | * | 5/1991 | Germer et al. | ............... 324/142 |
| 6,686,860 | B2 | * | 2/2004 | Gulati et al. | ................. 341/155 |
| 6,864,822 | B2 | * | 3/2005 | Gulati et al. | ................. 341/155 |

FOREIGN PATENT DOCUMENTS

JP      2001-196929 A      7/2001

* cited by examiner

*Primary Examiner*—Lam T. Mai
(74) *Attorney, Agent, or Firm*—Arent Fox LLP

(57) ABSTRACT

The analog-to-digital converter directly acquires a supplied clock signal, generates a current control signal depending on the sampling frequency of the clock signal, so as to control a current value. Thus, it becomes possible to control the current to an optimal value according to the sampling frequency, irrespective of the clock signal generation means, achieving low power consumption in the analog-to-digital converter.

4 Claims, 2 Drawing Sheets

ANALOG-TO-DIGITAL CONVERTER AND ANALOG-TO-DIGITAL CONVERSION METHOD

CROSS-REFERENCE TO RELATED APPLICATIONS

This application is based upon and claims the benefit of priority from the prior Japanese Patent Application No. 2005-249813, filed on Aug. 30, 2005, the entire contents of which are incorporated herein by reference.

BACKGROUND OF THE INVENTION

1. Field of the Invention

The present invention relates to an analog-to-digital converter and an analog-to-digital conversion method in which a supply current can be controlled corresponding to a sampling frequency.

2. Description of the Related Art

With an increasing demand for low power consumption in a digital apparatus (for example, thin television such as liquid crystal television and plasma display television) having an analog-to-digital converter mounted thereon, it is required to reduce power consumption in the analog-to-digital converter.

Meanwhile, the analog-to-digital converter is required to handle a variety of sampling frequencies, which influence the power consumption of the converter. The higher the sampling frequency is, the greater the consumption current becomes, and accordingly, the larger the power consumption becomes. Therefore, in designing an analog-to-digital converter adapted for a required sampling frequency, the analog-to-digital converter has to be designed individually for each sampling frequency, because an operating current value differs with each sampling frequency. This produces an increased development cost.

In contrast, there is another type of analog-to-digital converter capable of handling a plurality of variable sampling frequencies. When the current value is fixed in the analog-to-digital converter of this type, the supply current value has to be set to a current value (the maximum current value) with which the analog-to-digital converter is operable at the highest sampling frequency. As a result, when the analog-to-digital converter is operated at a lower sampling frequency than the highest sampling frequency, electric current is wasted because the current value remains constant (i.e. the maximum current value) although the analog-to-digital converter can be operated at a lower current value (operable current value) than the supplied current value. Namely, an electric current for the difference between the maximum current value and the operable current value is wasted.

Accordingly, it has been desired to develop an analog-to-digital converter to which an optimal operating current is supplied depending on a sampling frequency.

Meanwhile, in the official gazette of the Japanese Unexamined Patent Publication No. 2001-196929 (which is referred to as patent document 1), there is disclosed an analog-to-digital converter of which supply current is variably controlled, depending on a sampling frequency of a clock signal generated by a PLL (phase locked loop) circuit.

According to the above patent document 1, a bias circuit for supplying the electric current is controlled using an output signal from the PLL circuit generating the clock signal. In other words, when the PLL circuit is not used as the clock signal generation means, the method disclosed in the above patent document 1 is not applicable. In particular, when it is required to employ a highly accurate clock signal with an extremely small jitter, it may be considered to supply the clock signal from an oscillator circuit using, for example, a crystal oscillator, in place of the PLL circuit.

SUMMARY OF THE INVENTION

Accordingly, it is an object of the present invention to provide an analog-to-digital converter and an analog-to-digital conversion method with low power consumption, by supplying an optimal operating current depending on a sampling frequency, irrespective of the type of a clock signal generation means.

According to the present invention, as a first configuration of an analog-to-digital converter to achieve the aforementioned object, the analog-to-digital converter includes: an analog-to-digital conversion unit receiving an input clock signal of a predetermined sampling frequency, and converting an analog signal into a digital signal according to the sampling frequency; a current supply unit for supplying an electric current to the analog-to-digital conversion unit; and a current control unit acquiring the clock signal, generating a control signal corresponding to the sampling frequency of the clock signal, and controlling the electric current supplied from the current supply unit, by means of the above control signal.

As a second configuration of the analog-to-digital converter according to the present invention, in the above first configuration, the current control unit further includes: a pulse generation unit for generating pulse signals of which number corresponds to the sampling frequency of the clock signal; and a control signal generation unit generating the control signal according to the number of the above pulse signals.

As a third configuration of the analog-to-digital converter according to the present invention, in the above first and second configuration, power supply to the current control unit is shut off when a predetermined period elapses after the start of operation of the current control unit, and the operation of the current control unit is halted.

As a first analog-to-digital conversion method according to the present invention, the analog-to-digital conversion method includes: receiving an input clock signal of a predetermined sampling frequency, and converting an analog signal into a digital signal according to the sampling frequency; supplying an electric current to the analog-to-digital conversion; acquiring the clock signal; generating a control signal corresponding to the sampling frequency of the clock signal; and controlling the supplied electric current, by means of the above control signal.

As a second analog-to-digital conversion method according to the present invention, in the above first analog-to-digital conversion method, the step of generating includes generating pulse signals of which number corresponds to the sampling frequency of the clock signal, and generating the control signal according to the number of the above pulse signals.

As a third analog-to-digital conversion method according to the present invention, in the above first or second analog-to-digital conversion method, current supply for the operation of the step of controlling is shut off when a predetermined period elapses after the start of the operation of the step of controlling, and the operation of the step of controlling is halted.

According to the present invention, it is possible to provide an analog-to-digital converter and an analog-todigital conversion method with reduced power consumption, by supplying an optimal operating current depending on a sampling frequency, irrespective of the type of a clock signal generation unit.

Further scopes and features of the present invention will become more apparent by the following description of the embodiments with the accompanied drawings.

DETAILED DESCRIPTION OF THE INVENTION

The preferred embodiment of the present invention is described hereinafter referring to the charts and drawings. However, it is to be noted that the technical scope of the present invention is not limited to the embodiments described below.

Figure 1:
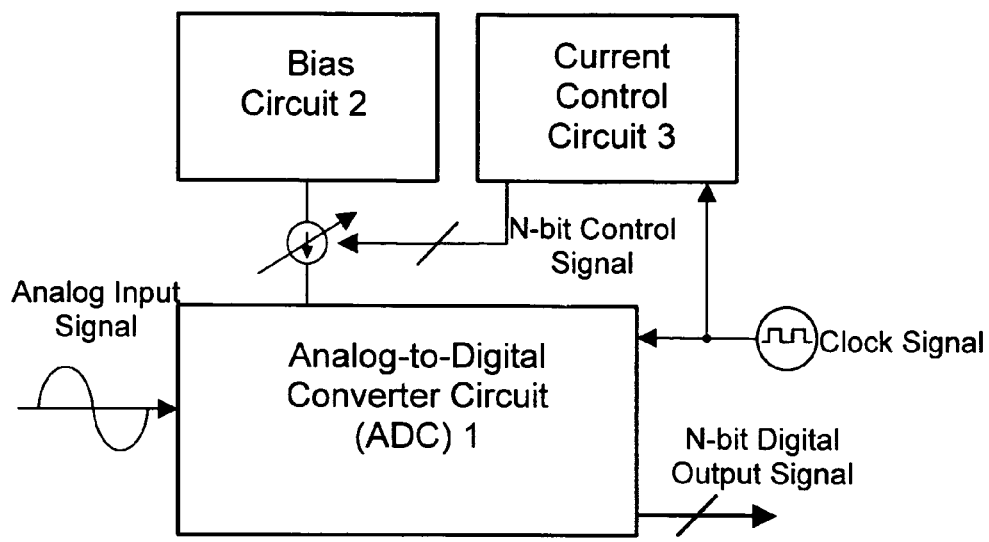
FIG. 1 shows an exemplary block diagram of an analog-to-digital converter according to an embodiment of the present invention.

FIG. 1 is an exemplary block diagram of an analog-to-digital converter according to an embodiment of the present invention. In this FIG. 1, on receipt of an input analog signal, an analog-to-digital conversion circuit (ADC) 1 converts the analog signal into a digital signal according to the sampling frequency of a clock signal being input thereto, and outputs the converted signal. A bias circuit 2 supplies electric current to the ADC 1. A current control circuit 3, a distinctive element in the embodiment of the present invention, controls the electric current supplied from the bias circuit 2, based on the sampling frequency of the clock signal being input to the ADC 1.

Figure 2:
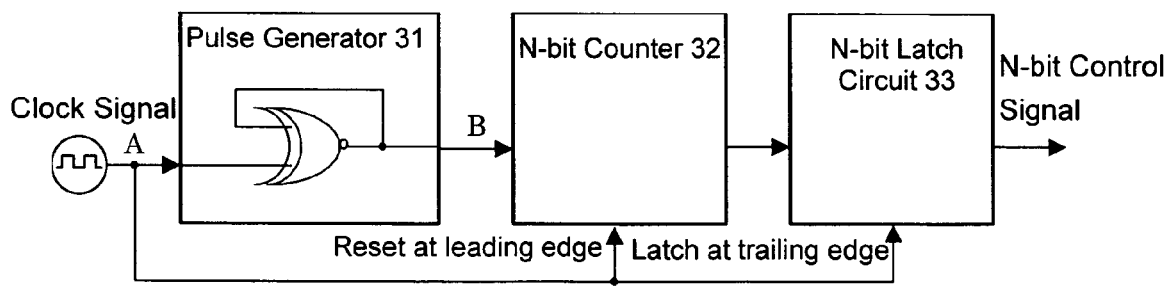
FIG. 2 shows a diagram illustrating an exemplary configuration of a current control circuit 3.

FIG. 2 is a diagram illustrating an exemplary configuration of the current control circuit 3. The current control circuit 3 is provided with a pulse generator 31, an n-bit counter 32 and an n-bit latch circuit 33. The pulse generator 31 is structured of, for example, an exclusive-OR circuit, which receives both the input clock signal and a feedback input of the output of the exclusive-OR circuit concerned.

Figure 3A:
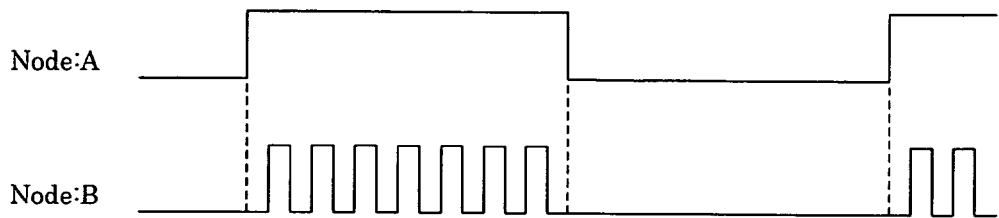
FIGS. 3A, 3B show timing charts at a node A and a node B shown in FIG. 2.
Figure 3B:
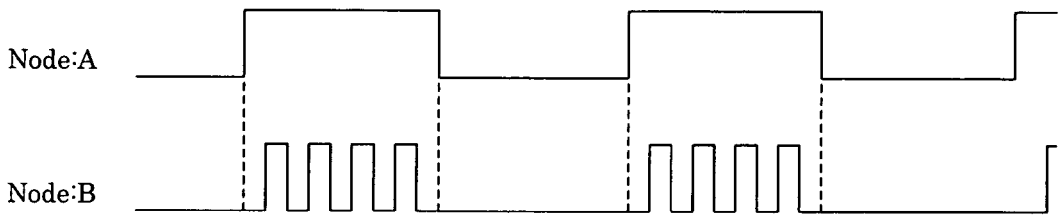

FIGS. 3A, 3B are timing charts at a node A and a node B shown in FIG. 2. The chart shown as node A represents the timing chart of the input clock signal, while the chart shown as node B represents the timing chart of the output signal of the pulse generator 31. As shown in FIGS. 3A, 3B, through the logic operation of exclusive-OR, the pulse generator 31 outputs pulse signals during the time duration in which the clock signal stays in the H-level. The number of pulse signals corresponds to the length (or the sampling frequency) of the above time duration. The cycle of the pulse signal is determined by a delay amount of the exclusive-OR circuit element, and a feedback delay amount. The smaller the delay amount is, the shorter the pulse width (cycle) can be made. Thus, the sampling frequency of the clock signal can be resolved with high accuracy. If the pulse width is adjusted to be constant, the number of pulses being output during the H-level duration corresponds to the time duration of the H-level, namely the sampling frequency. In other words, the lower the sampling frequency is (or the slower the clock speed is), the greater the number of output pulse signals becomes. In the examples shown in FIGS. 3A, 3B, since the sampling frequency of the clock signal shown in FIG. 3A is lower than the sampling frequency of the clock signal shown in FIG. 3B, the number of pulses in the case of FIG. 3A becomes larger than the number of pulses in the case of FIG. 3B. Here, the structure of the pulse generator 31 is not limited to the structure shown in FIG. 2 having the exclusive-OR circuit. To generate pulses of which number corresponds to the sampling frequency of the clock signal, a plurality of logic operation circuit types may be considered.

The pulse signal output from the pulse generator 31 is input to the n-bit counter 32. Triggered by each leading edge of the clock signal pulses, the n-bit counter 32 counts the number of pulses. The n-bit latch circuit 33 is structured of, for example, flip-flop circuits, so as to latch the outputs of the n-bit counter 32. The n-bit latch circuit 33 outputs an n-bit signal corresponding to the number of pulses being counted at the timing of the trailing edges of the clock signal. Namely, a signal indicating the number of clock signal pulses in one clock period (sampling frequency) is output from the latch circuit 32.

The output signal from the latch circuit 32 controls an electric current signal supplied from the bias circuit 2. By use of a known current mirror circuit or the like, the electric current supplied from the bias circuit 2 is controlled according to the number of signal pulses being output from the latch circuit 32.

Figure 4:
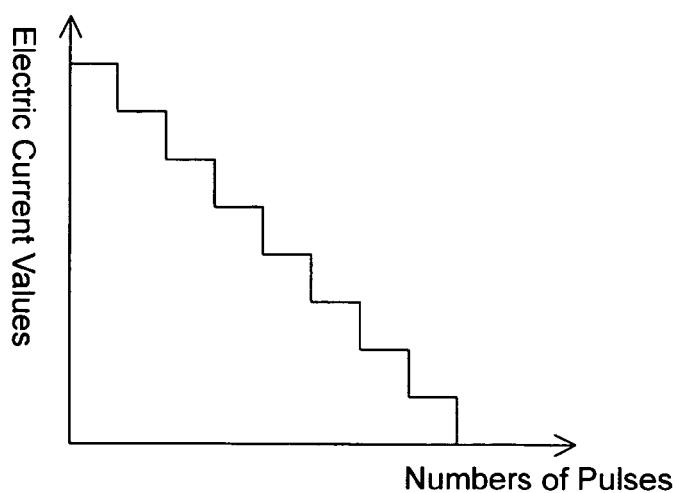
FIG. 4 shows a diagram illustrating the relationship between numbers of pulses and electric current values.

FIG. 4 is a diagram illustrating the relationship between numbers of pulses and electric current values. The lower the sampling frequency is (the longer the period is), the greater the number of pulses becomes. Accordingly, as shown in FIG. 4, the electric current value is controlled to be smaller as the number of pulses increases. According to the sampling frequency, an optimal current value is set.

It is considered that the sampling frequency of the clock signal does not change during the operation of the analog-to-digital converter. Accordingly, it may also be possible to stop power supply to the current control circuit 3 when a predetermined time elapses from the start of operation of the analog-to-digital converter (namely, the start of operation of the current control circuit 3), after the completion of the current optimization control according to the present invention. With this, the consumption power in the current control circuit 3 can be reduced. When a predetermined time elapses after the start of operation of the analog-to-digital converter, by shutting off a connection switch of the current control circuit 3 to the power circuit using an embedded or external timer circuit, or by other suitable means, a power supply stop operation to the current control circuit 3 is performed.

According to the embodiment of the present invention, the analog-to-digital converter directly acquires a supplied clock signal, generates a current control signal corresponding to the sampling frequency of the clock signal, and controls an electric current value. Accordingly, it is possible to control the electric current value to the optimum corresponding to the sampling frequency, irrespective of clock generation means. Thus, reduced power consumption in the analog-to-digital converter can be achieved. Furthermore, by stopping power supply to the current control circuit 3 after optimizing the current value, the consumption power in the current control circuit 3 can also be reduced, making it possible to achieve lower power consumption in the overall analog-to-digital converter.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. An analog-to-digital converter comprising:
    an analog-to-digital conversion unit receiving an input clock signal of a predetermined sampling frequency, and converting an analog signal into a digital signal according to the sampling frequency;
    a current supply unit supplying an electric current to the analog-to-digital conversion unit; and
    a current control unit acquiring the clock signal, generating a control signal corresponding to the sampling frequency of the clock signal, and controlling the electric current supplied from the current supply unit, by means of said control signal, the current control unit including a pulse generation unit generating pulse signals of which number corresponds to the sampling frequency of the clock signal; and a control signal generation unit generating the control signal according to the number of said pulse signals.

2. An analog-to-digital converter comprising:
    an analog-to-digital conversion unit receiving an input clock signal of a predetermined sampling frequency, and converting an analog signal into a digital signal according to the sampling frequency;
    a current supply unit supplying an electric current to the analog-to-digital conversion unit; and
    a current control unit acquiring the clock signal, generating a control signal corresponding to the sampling frequency of the clock signal, and controlling the electric current supplied from the current supply unit, by means of said control signal,
    wherein power supply to the current control unit is shut off when a predetermined period elapses after a start of operation of the current control unit, and the operation of the current control unit is halted.

3. An analog-to-digital conversion method comprising the steps of:
    receiving an input clock signal of a predetermined sampling frequency, and converting an analog signal into a digital signal according to the sampling frequency;
    supplying an electric current to the analog-to-digital conversion;
    acquiring the clock signal;
    generating a control signal corresponding to the sampling frequency of the clock signal by generating pulse signals of which number corresponds to the sampling frequency of the clock signal, and generating the control signal according to the number of said pulse; and
    controlling the supplied electric current, by means of said control signal.

4. An analog-to-digital conversion method comprising the steps of:
    receiving an input clock signal of a predetermined sampling frequency, and converting an analog signal into a digital signal according to the sampling frequency;
    supplying an electric current to the analog-to-digital conversion;
    acquiring the clock signal;
    generating a control signal corresponding to the sampling frequency of the clock signal; and
    controlling the supplied electric current, by means of said control signal,
    wherein current supply for the operation of the step of controlling is shut off when a predetermined period elapses after the start of the operation of the step of controlling, and the operation of the step of controlling is halted.

* * * * *